(12) United States Patent
Yan et al.

(10) Patent No.: US 9,741,625 B2
(45) Date of Patent: Aug. 22, 2017

(54) METHOD OF FORMING A SEMICONDUCTOR DEVICE WITH STI STRUCTURES ON AN SOI SUBSTRATE

(71) Applicant: GLOBALFOUNDRIES Inc., Grand Cayman (KY)

(72) Inventors: Ran Yan, Dresden (DE); Alban Zaka, Dresden (DE); Pei-Yu Chou, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 49 days.

(21) Appl. No.: 14/844,163

(22) Filed: Sep. 3, 2015

(65) Prior Publication Data

US 2017/0069550 A1    Mar. 9, 2017

(51) Int. Cl.
*H01L 21/8238* (2006.01)
*H01L 21/762* (2006.01)
*H01L 27/092* (2006.01)
*H01L 21/3105* (2006.01)
*H01L 21/02* (2006.01)

(52) U.S. Cl.
CPC .. *H01L 21/823878* (2013.01); *H01L 21/0223* (2013.01); *H01L 21/02164* (2013.01); *H01L 21/02255* (2013.01); *H01L 21/02532* (2013.01); *H01L 21/31055* (2013.01); *H01L 21/76283* (2013.01); *H01L 21/823807* (2013.01); *H01L 27/092* (2013.01)

(58) Field of Classification Search
CPC ....... H01L 21/76283; H01L 21/823878; H01L 21/823807
See application file for complete search history.

(56) References Cited

U.S. PATENT DOCUMENTS

| | | | |
|---|---|---|---|
| 2003/0013305 A1* | 1/2003 | Sugii | H01L 21/02381 438/689 |
| 2011/0108943 A1* | 5/2011 | Dennard | H01L 21/76254 257/506 |
| 2014/0339638 A1* | 11/2014 | Cheng | H01L 27/1203 257/347 |

* cited by examiner

*Primary Examiner* — Zandra Smith
*Assistant Examiner* — Molly Reida
(74) *Attorney, Agent, or Firm* — Amerson Law Firm, PLLC (57) ABSTRACT

In a first aspect, the present disclosure provides a method of forming a semiconductor device, including providing an SOI structure comprising a base substrate, a buried insulating material layer formed on the base substrate and an active semiconductor layer formed on the buried insulating structure, forming a germanium-comprising layer on an exposed surface of the active semiconductor layer, forming a trench isolation structure, the trench isolation structure extending through the germanium-comprising layer and the active semiconductor layer, performing an annealing process after the trench isolation structure is formed, the annealing process resulting in an oxide layer disposed on a germanium-comprising active layer which is formed on the buried insulating material layer, and removing the oxide layer for exposing an upper surface of the germanium-comprising active layer.

20 Claims, 8 Drawing Sheets

METHOD OF FORMING A SEMICONDUCTOR DEVICE WITH STI STRUCTURES ON AN SOI SUBSTRATE

BACKGROUND OF THE INVENTION

1. Field of the Invention

The present disclosure relates to a method of forming a semiconductor device and to a method of forming a CMOS device and, more particularly, to forming CMOS devices in accordance with STI structures at advanced technology nodes.

2. Description of the Related Art

For next generation technologies, SOI (semiconductor-on-isolator) technology is an attractive candidate to push forward the frontiers imposed by Moore's law. Particularly, fully depleted SOI (FDSOI) techniques seem to provide promising technologies that allow the fabrication of semiconductor devices at technology nodes of 28 nm and beyond. Aside from FDSOI techniques allowing the combination of high performance and low power consumption, complemented by an excellent responsiveness to power management design techniques, the fabrication processes, as employed in FDSOI techniques, are comparatively simple and actually represent a low risk evolution of conventional planar bulk CMOS techniques.

In general, a MOSFET as fabricated by SOI techniques is a semiconductor device (MOSFET) in which a semiconductor layer, such as silicon, germanium or silicon-germanium, is formed on a buried oxide (BOX) layer, which is in turn formed on a semiconductor substrate. Conventionally, there are two types of SOI devices: PDSOI (partially depleted SOI) and FDSOI MOSFETs. For example, in an N-type PDSOI MOSFET, a P-type film being sandwiched between a gate oxide (GOX) and a buried oxide (BOX) is so large that the depletion region cannot cover the whole vertical thickness of the P-region. Therefore, to some extent, PDSOI devices behave like bulk MOSFETs. In contrast, in an FDSOI device, the depletion region covers the whole vertical thickness of the semiconductor layer. As the gate insulation layer in FDSOI techniques supports fewer depletion charges than the bulk, an increase in inversion charges occurs in the fully depleted semiconductor layer, resulting in higher switching speeds. Therefore, FDSOI is considered as a promising candidate for fabricating MOSFET devices at advanced technology nodes of 28 nm and beyond, such as 20 nm and beyond.

A further approach for improving the performance of semiconductor devices employs strained silicon-germanium which enhances the mobility of holes in channels of PMOS devices, for example. In conventional FDSOI techniques, silicon-germanium is deposited before shallow trench isolation (STI) structures are formed in order to provide a silicon-germanium layer of good uniformity on the SOI wafer such that a particular stressor level is provided. It turns out that the particular stressor level of the deposited silicon-germanium layer, however, cannot be maintained throughout the processing and significant loss of stress is observed in fabricated CMOS devices.

In view of the above, it is desirable to provide a semiconductor device and a CMOS device at advanced technology nodes without losing the benefit of applying silicon-germanium layers as stressors for enhancing mobility in PMOS devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In accordance with a first aspect of the present disclosure, a method of forming a semiconductor device is provided. In some illustrative embodiments herein, the method including providing an SOI structure comprising a base substrate, a buried insulating material layer formed on the base substrate and an active semiconductor layer formed on the buried insulating structure, forming a germanium-comprising layer on an exposed surface of the active semiconductor layer, forming a trench isolation structure, the trench isolation structure extending through the germanium-comprising layer and the active semiconductor layer, performing an annealing process after the trench isolation structure is formed, the annealing process resulting in an oxide layer disposed on a germanium-comprising active layer formed on the buried insulating material layer, and removing the oxide layer, wherein an upper surface of the germanium-comprising active layer is exposed.

In accordance with a second aspect of the present disclosure, a method of forming a CMOS structure is provided. In some illustrative embodiments herein, the method includes providing an SOI substrate comprising a base substrate, a buried insulating material layer formed on the base substrate and an active semiconductor layer formed on the base substrate and an active semiconductor layer formed on the buried insulating structure, forming a germanium-comprising layer on an exposed surface of the active semiconductor layer, forming a trench isolation structure, the trench isolation structure extending through the germanium-comprising layer and the active semiconductor layer, the trench isolation structure defining at least a first active region in which a PMOS device is to be formed and a second active region in which an NMOS device is to be formed, depositing a nitride material on the first active region and the second active region, selectively removing the nitride material in the first active region and leaving the nitride material in the second active region, performing an annealing process after the nitride material layer is selectively removed, the annealing process resulting in an oxide layer disposed on a germanium-comprising active layer formed on the buried insulating material layer in the first active region, and removing the oxide layer, wherein an upper surface of the germanium-comprising active layer in the first active region is exposed.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to various methods of forming a semiconductor device and to various methods of forming a CMOS device, wherein the semiconductor devices are integrated on or in a chip. In accordance with some illustrative embodiments of the present disclosure, the semiconductor devices may substantially represent FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

Semiconductor devices of the present disclosure concern devices which may be fabricated by using advanced technologies, i.e., the semiconductor devices may be fabricated by technologies applied to approach technology nodes smaller than 100 nm, for example, smaller than 50 nm or smaller than 35 nm, e.g., at 28 nm or below. After a complete review of the present application, the person skilled in the art will appreciate that, according to the present disclosure, ground rules smaller or equal to 45 nm, e.g., at 28 nm or below, that is, at 20 nm and below, may be imposed, but the present invention is not limited to such examples. After a complete review of the present application, the person skilled in the art will also appreciate that the present disclosure may be employed in fabricating semiconductor devices with structures of minimal length dimensions and/or width dimensions smaller than 100 nm, for example, smaller than 50 nm or smaller than 35 nm or smaller than 28 nm, e.g., at 20 nm or below. For example, the present disclosure may provide semiconductor devices fabricated by using 45 nm technologies or below, e.g., 28 nm or even below, such as 20 nm and below.

After a complete reading of the present application, a person skilled in the art will appreciate that semiconductor devices may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device under design.

In accordance with illustrative embodiments of the present disclosure, SOI devices have an active semiconductor layer disposed on a buried insulating material layer, which, in turn, is formed on a base substrate material. In accordance with certain illustrative examples, the active semiconductor layer may be silicon. In accordance with special illustrative examples, the buried insulating material layer may comprise an insulating material, e.g., silicon dioxide or silicon nitride. In accordance with special illustrative examples, the base substrate material may be a base material that may be used as a substrate as known in the art, e.g., silicon and the like. After a complete review of the present application, the person skilled in the art will appreciate that, in accordance with illustrative embodiments employing FDSOI substrates, the active semiconductor layer may have a thickness of about 20 nm or less, while the buried insulating material layer may have a thickness of about 145 nm or, in accordance with advanced techniques, the buried insulating material layer may have a thickness in a range from about 10-30 nm. For example, in some special illustrative embodiments of the present disclosure, the active semiconductor layer may have a thickness of about 6-10 nm.

As to a crystallographic plane orientation of the base substrate material, similar to that of an ordinary silicon device, an SOI substrate whose surface is a face (100) may be used. However, in order to improve the performance of a PMOS semiconductor device, a surface of the PMOS semiconductor device may be used as a face (110). Alternatively, a hybrid plane orientation substrate whose surface may be mixed by a face (100) and a face (110) may be used. In case that a passive device, such as a varactor device, is fabricated, there is no restriction on a crystal plane orientation such that an impurity concentration, film thickness, dimension ratio of the device and the like can be appropriately adjusted to obtain a capacitance characteristic that is suitable according to the plane orientation set by other requirements. In alternative embodiments, the base substrate material may be of an N-type when N-accumulation and/or N-inversion devices are considered (otherwise P-type for P-accumulation and/or P-inversion).

Figure 1A:
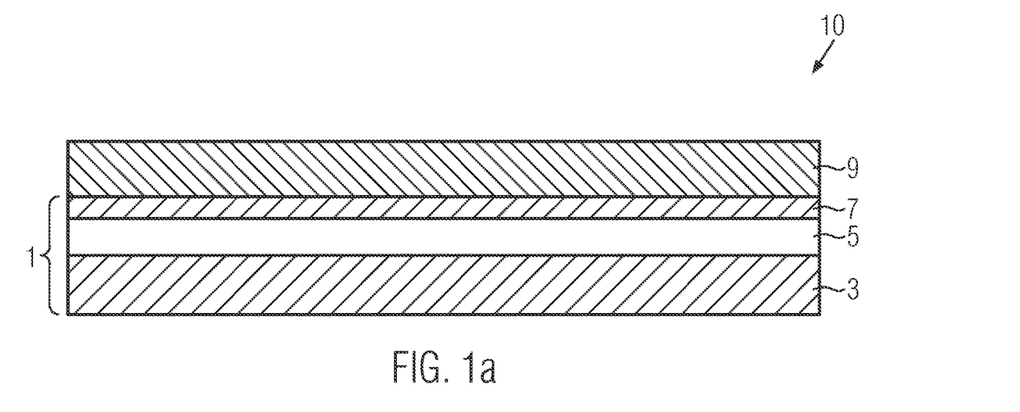
FIGS. 1a-1g schematically illustrate in cross-sectional views a process of forming a trench isolation structure in accordance with some illustrative embodiments of the present disclosure.

FIG. 1a schematically illustrates a semiconductor device structure at an early stage during fabrication, when a silicon-germanium layer 9 is formed on an SOI wafer 1. The silicon-germanium layer 9 may represent an illustrative example of a germanium-comprising layer of the first and second aspects of the disclosure. In accordance with some illustrative embodiments of the present disclosure, the silicon-germanium layer 9 may be $Si_{1-x}Ge_x$, where x is in a range from about 0.1 to about 0.5, e.g., at about 0.3.

In accordance with some illustrative embodiments of the present disclosure, the SOI wafer 1 may comprise a base substrate 3 on which a buried insulating material layer 5 is formed, wherein the buried insulating material layer 5 may be interposed between the base substrate 3 and an active semiconductor layer 7. In accordance with some illustrative examples herein, the base substrate 3 may be formed from silicon. In accordance with some illustrative examples, the buried insulating material layer 5 may be formed by one of a silicon oxide material, e.g., $SiO_2$, and a silicon nitride material, e.g., $Si_3N_4$ or SiN. In accordance with some illustrative embodiments of the present disclosure, the active semiconductor layer 7 may be intrinsic silicon material.

Figure 1B:
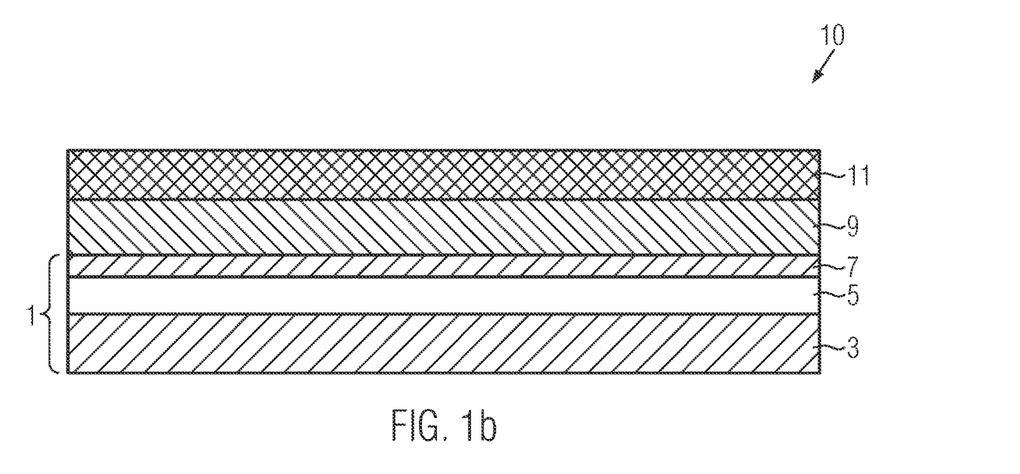

With regard to FIG. 1b, the semiconductor device structure 10 is schematically illustrated at a more advanced stage during fabrication, after a passivation layer 11 is formed on the silicon-germanium layer 9. The passivation layer 11 may be formed by one of a nitride material (e.g., as a nitride material layer) and an oxide material, e.g., silicon oxide. In accordance with some illustrative examples, the passivation layer 11 may be deposited by chemical vapor deposition (CVD) techniques.

Figure 1C:
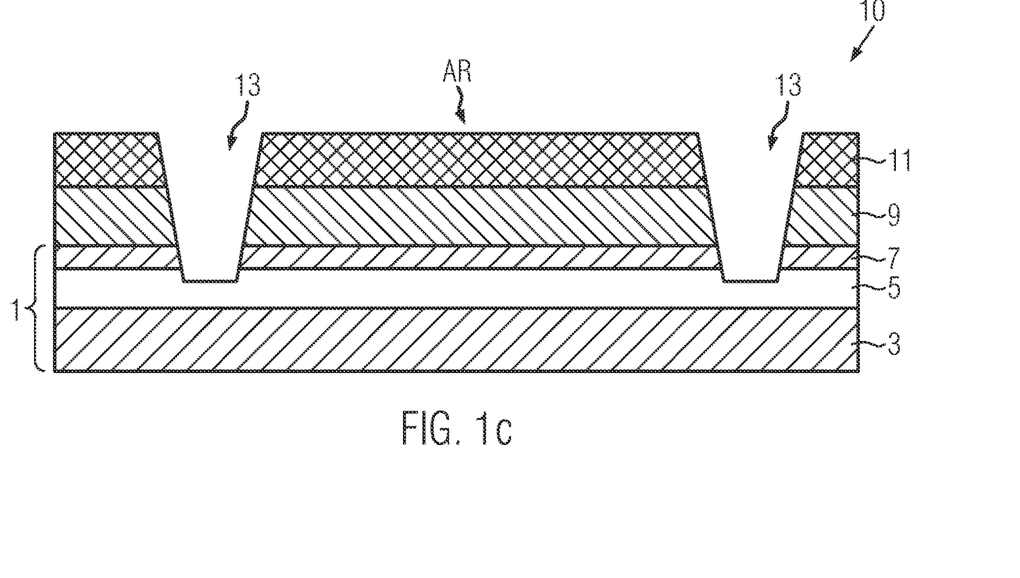

With regard to FIG. 1c, the semiconductor device structure 10 is schematically illustrated at a more advanced stage during fabrication, after a patterning of the semiconductor device structure 10 of FIG. 1b is performed. In accordance with some illustrative embodiments of the present disclosure, the patterning may be performed by forming a masking pattern (not illustrated) on an upper surface of the passivation layer 11 and performing an anisotropic etch process, e.g., a reactive ion etch (RIE) process or the like, through the deposited masking pattern (not illustrated), wherein trenches 13 are etched into the semiconductor device structure 10. The masking pattern (not illustrated) may include depositing a mask layer, such as a photoresist, and lithographically patterning the deposited mask layer (not illustrated).

As illustrated in FIG. 1c, the semiconductor device structure 10 may be patterned such that at least one active region AR may be formed. In accordance with some illustrative embodiments of the present disclosure, the trenches 13 delimiting the active region AR may extend through the passivation layer 11, the silicon-germanium layer 9, and the active semiconductor layer 7 into the buried insulating material layer 5. The trenches may at least partially extend into the buried insulating material layer 5 (wherein shallow trench isolation (STI) structures are formed) and may optionally even extend into the base substrate 3 in order to form deep trenches in some special illustrative embodiments of the present disclosure.

Figure 1D:
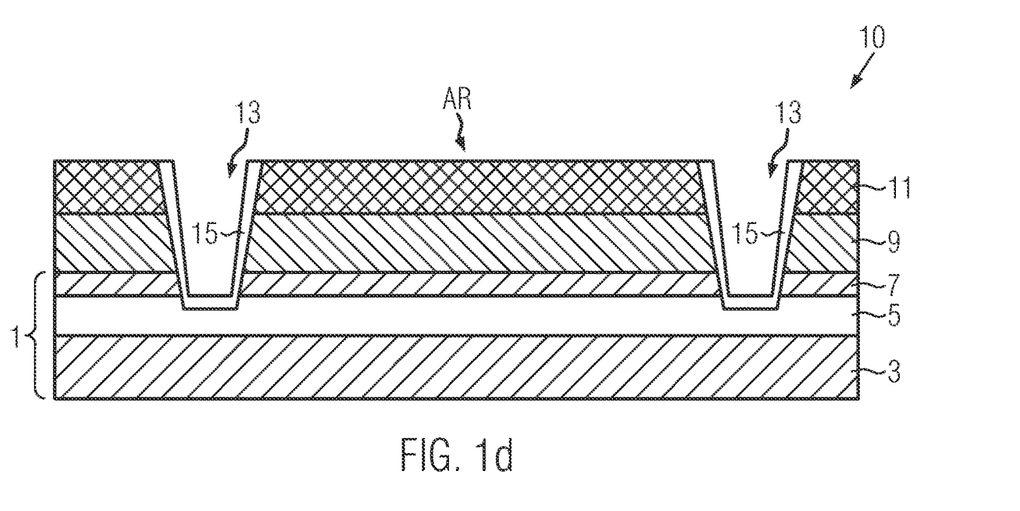

With regard to FIG. 1d, the semiconductor device structure 10 is schematically illustrated at a more advanced stage during fabrication, after an isolation liner 15 covering inner sidewalls and a bottom of each of the trenches 13 is formed. The isolation liner 15 may, for example, be formed in an oxidation process, wherein a thin liner of silicon dioxide material may be formed.

Figure 1E:
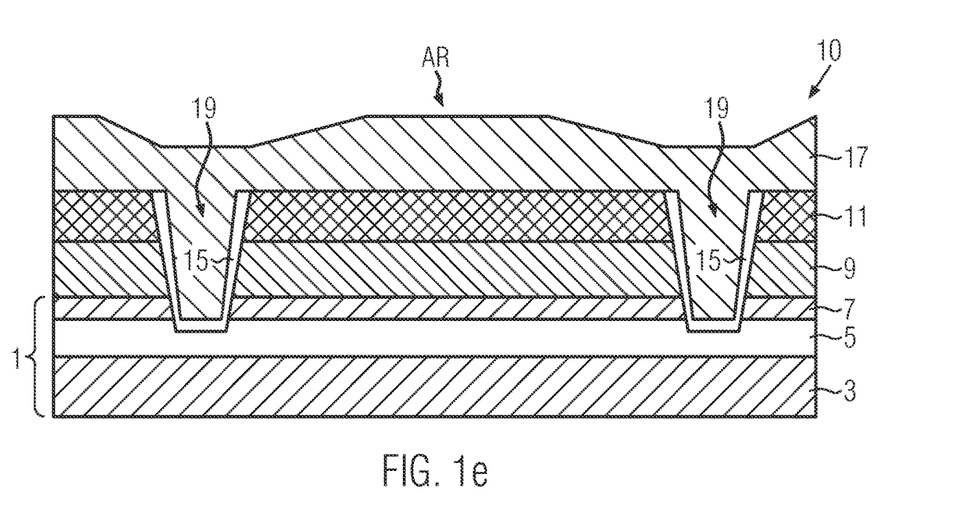

With regard to FIG. 1e, the semiconductor device structure 10 is schematically illustrated at a more advanced stage during fabrication, after a trench isolation forming material 17 is deposited for filling the trenches 13 such that trench isolation structures 19 are formed. In accordance with some illustrative examples herein, the trench isolation forming material may be a silicon dioxide material, e.g., $SiO_2$. In accordance with some illustrative embodiments of the present disclosure, the isolation liner 15 may remain on top of the passivation layer 11 and may then be polished away (possibly together with the HARP) at a later stage, e.g., at a stage illustrated in FIG. 1g and described below.

Figure 1F:
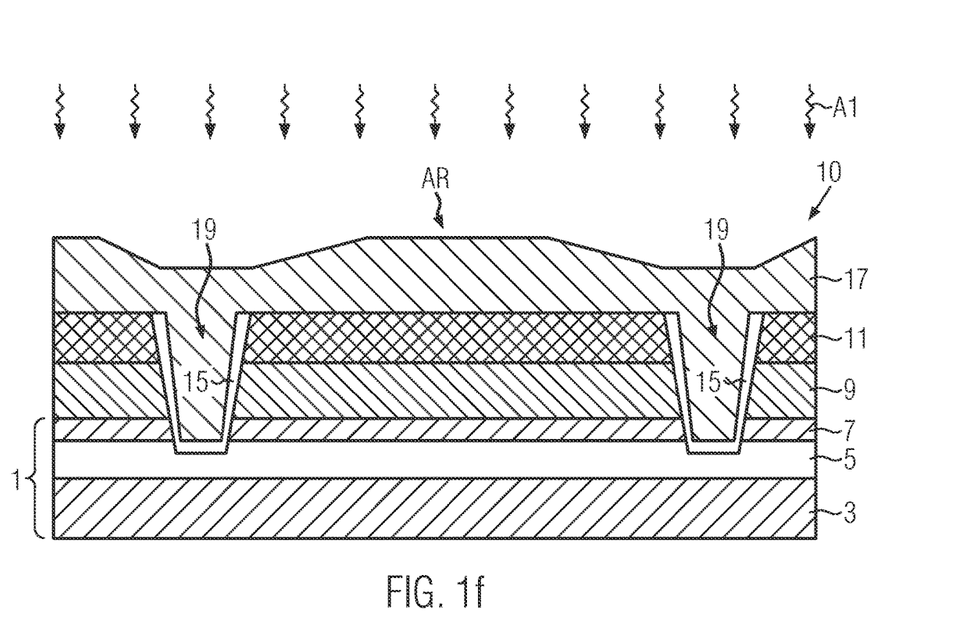

With regard to FIG. 1f, the semiconductor device 10 is schematically illustrated at a more advanced stage during fabrication, when an annealing process A1 (e.g., a HARP anneal) may be performed, providing for a good fill-in of the trench isolation forming material 17 in the trenches 13 (FIG. 1d). In accordance with some illustrative embodiments of the present disclosure, the annealing process A1 may be performed at a temperature in the range of about 1000-1100° C., e.g., at 1050° C., with a duration between 15-25 minutes, e.g., with a duration of about 20 minutes. In accordance with a special illustrative example herein, the annealing process A1 may comprise a slow temperature ramp down and may, additionally or alternatively, include a pre-temperature exposure process for a duration of about 15 minutes at about 700° C. Of course, this illustrative example does not pose any limitation on the present disclosure and the annealing process A1 may be omitted instead.

Figure 1G:
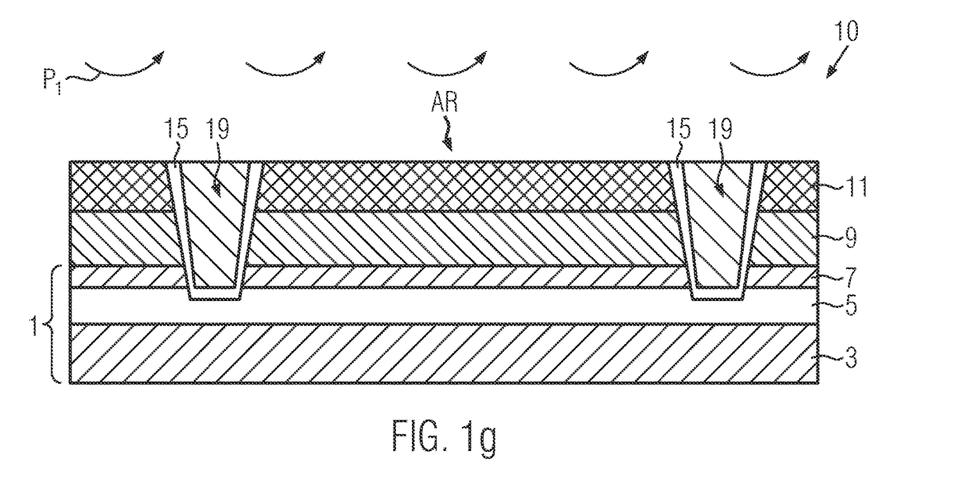

With regard to FIG. 1g, the semiconductor device 10 is schematically illustrated at a more advanced stage during fabrication, after a polishing process P1, such as a chemical mechanical polishing (CMP) process, is performed. Herein, the trench isolation forming material 17 may be removed and the semiconductor device structure 10 as illustrated in Figure if may be planarized down until an upper surface of the passivation layer 11 is exposed. In accordance with some illustrative examples herein, a material of the passivation layer 11 may be chosen such that the passivation layer 11 may act as a stop layer for the polishing process P1.

Figure 2A:
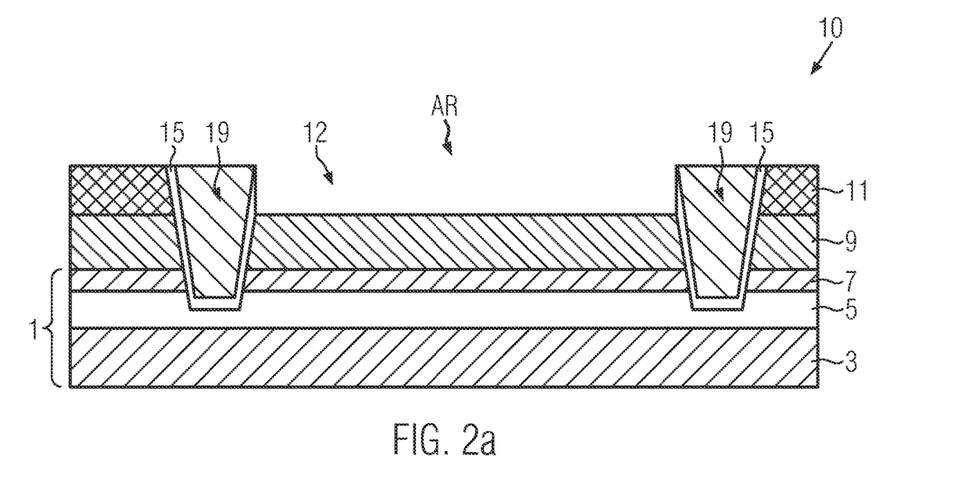
FIGS. 2a-2e schematically illustrate in cross-sectional views a process of forming a silicon-germanium layer in an active region in accordance with some illustrative embodiments of the present disclosure.

With regard to FIG. 2a, the semiconductor device structure 10 is schematically illustrated at a more advanced stage during fabrication, after an upper surface of the silicon-germanium layer 9 is exposed in the active region AR. That is, the semiconductor structure device 10 as illustrated in FIG. 1g may be exposed to an etching process for removing the passivation layer 11 in the active region AR. During the removal of the passivation layer 11 in the active region AR, the passivation layer 11 outside the active region AR may be protected by a masking pattern (not illustrated) such that only the passivation layer 11 in the active region AR is removed and a trench 12 delineated by the trench isolation structures 19 is formed.

Figure 2B:
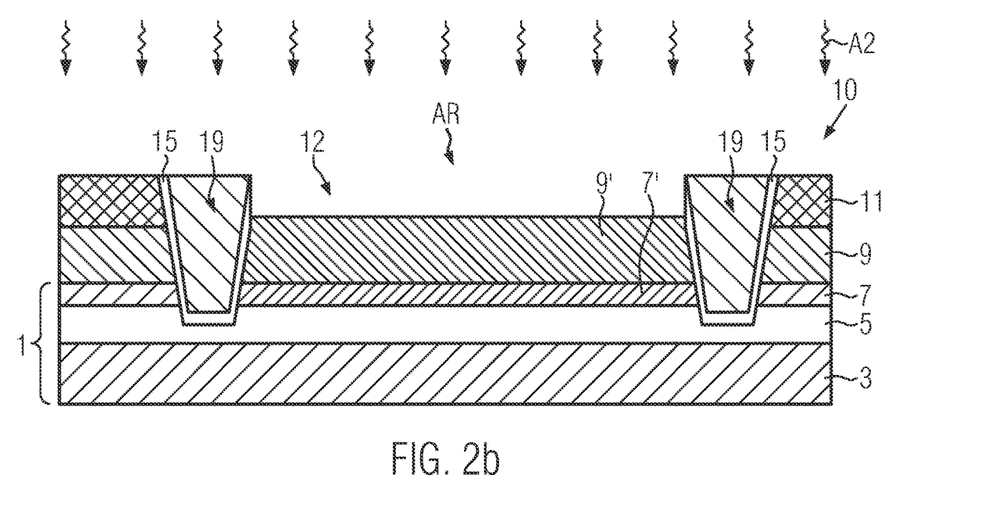

With regard to FIG. 2b, the semiconductor device structure 10 is schematically illustrated at a more advanced stage during fabrication, particularly when an annealing process A2 is performed. In accordance with some illustrative embodiments of the present disclosure, the annealing process A2 may comprise a dry oxidation process. In accordance with some special illustrative examples, the annealing process A2 may be a rapid thermal annealing (RTA) at a temperature in the range from about 800-1500° C., e.g., at about 1100° C., for a duration from a time interval between about 30-120 seconds, e.g., about 50 seconds or about 80 seconds.

Figure 2C:
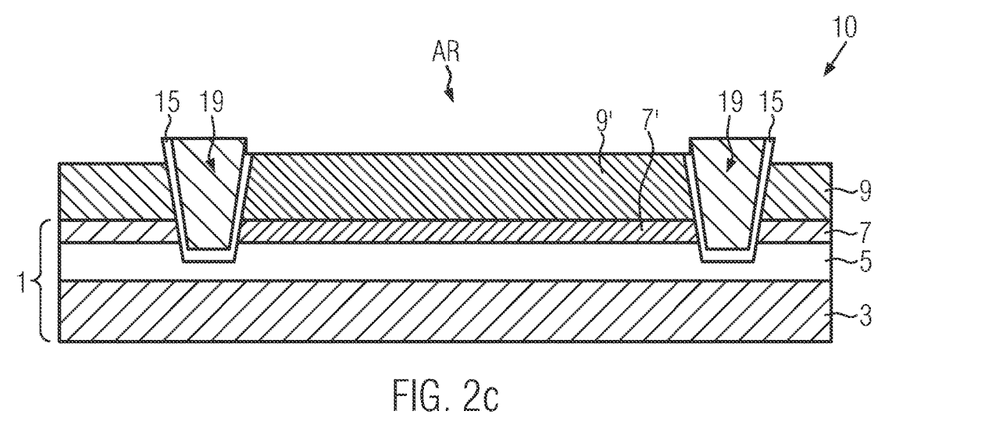

With regard to FIG. 2c, the semiconductor device 10 is schematically illustrated at a more advanced stage during fabrication, after the annealing process A2 is completed and the active semiconductor layer 7 in the active region AR is converted into an active silicon-germanium layer 7', while the initially provided silicon-germanium layer 9 (FIG. 2a) is oxidized and converted into a silicon oxide layer 9'. The active silicon-germanium layer 7' may represent an illustra- tive example of the germanium-comprising active layer of the first and second aspect of the present disclosure as indicated above. The silicon-germanium layer 7 outside the active region AR may be further protected by the passivation layer 9 during the annealing process A2. The passivation layer 9 outside the active region AR, i.e., the remaining passivation material from the anisotropic etching process as illustrated in FIG. 2a, may be removed.

The above-described technique of forming a germanium-comprising active layer from a germanium-comprising layer provided on an active semiconductor layer of an SOI substrate may be referred to as "germanium condensation anneal." In accordance with some illustrative embodiments of the present disclosure, a silicon-germanium condensation anneal may comprise a process of epitaxially growing a germanium-comprising layer, such as a silicon-germanium layer, having a germanium content in a range from about 10-50%, e.g., at about 20% or at about 30%, on an active semiconductor layer, such as a silicon layer (e.g., the active silicon layer 7 of the SOI substrate 1). Upon a high temperature dry oxidation process (e.g., the annealing process A2), selective oxidation of the semiconductor material in the active semiconductor layer, e.g., silicon, may occur. As a result, germanium may be driven from the germanium-comprising layer, such as the silicon-germanium layer, into the underlying active semiconductor layer, such as the silicon layer, and the germanium may be trapped in the underlying active semiconductor layer. As a consequence, the initially provided germanium-comprising layer, such as the silicon-germanium layer (e.g., the silicon-germanium layer 9), may lose its germanium content and may become oxidized, i.e., an oxide layer, such as a silicon oxide layer (e.g., the silicon oxide layer 9'), may be formed. After removal of the thermal oxide, that is the oxide layer, when the high temperature dry oxidation is completed, a germanium-comprising active layer, such as a silicon-germanium layer (e.g., the active silicon-germanium layer 9'), may be formed. After a complete reading of the present application, a person skilled in the art appreciates that the employed oxidation process may be thermodynamically selective towards the underlying active semiconductor material, such as silicon, such that germanium may be repelled from oxidizing at the interface and may remain trapped between an oxide formed on top and the buried insulating material, such as a buried oxide layer, below the active semiconductor layer of the SOI substrate on which a semiconductor device is to be formed.

In accordance with some special illustrative examples herein, the reactions that may occur are the following:

Accordingly, the germanium condensation principle as briefly pointed out above may be summarized as follows: an epitaxial germanium-comprising layer (e.g., the silicon-germanium layer 9) may be grown on an SOI substrate (e.g., the SOI substrate 1) and prepared as the starting material. Subsequently, the epitaxially grown germanium-comprising layer (e.g., the silicon-germanium layer 9) may be oxidized at high temperatures (e.g., the annealing process A2). As the oxidation proceeds, the germanium-comprising layer may become sandwiched between a thermal semiconductor oxide layer (e.g., the silicon oxide layer 9') semiconductor material in the germanium-comprising layer different from germanium becoming oxidized, thus forming the thermal oxide layer (e.g. the silicon oxide layer 9') above a germanium-comprising active layer (e.g., the active silicon-germanium 7') which becomes interposed between the thermal oxide layer (e.g., the silicon oxide layer 9') and a buried insulating material layer (e.g., the buried insulating material layer 5) of the SOI substrate (e.g., the SOI substrate 1). The active semiconductor layer on the buried insulating material layer becomes thinner, while the germanium content increases. The reason is that, as a result of the selective oxidation of semiconductor material (e.g., Si atoms in an active semiconductor layer formed of silicon), the Ge atoms rejected from the thermal oxide layer are incorporated into the active semiconductor layer, while they cannot diffuse over the buried insulating material layer acting as a barrier.

Figure 2D:
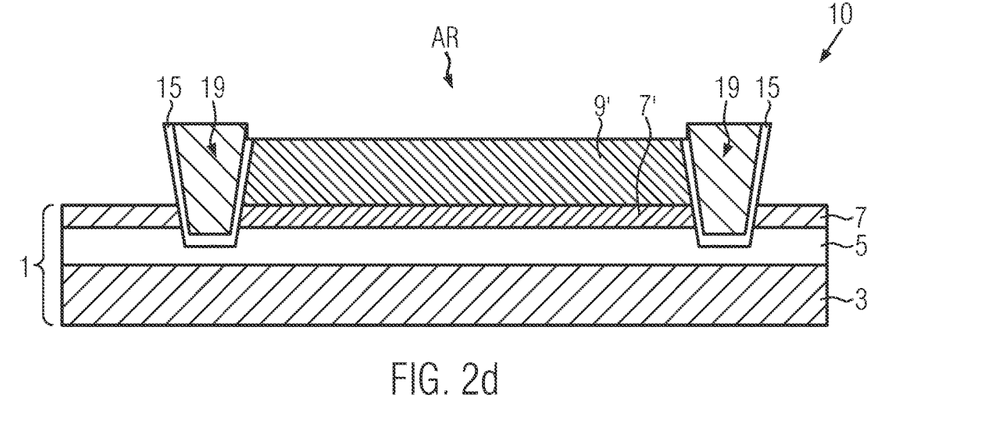

With regard to FIG. 2d, the semiconductor device 10 is schematically illustrated at a more advanced stage during fabrication, after the remaining passivation layer 11 and the remaining silicon-germanium layer 9 outside the active region AR are completely removed relative to the silicon oxide layer 9' in the active region AR. The selective etching processes employing etchants may be used for selectively etching the material of the passivation layer 11 and silicon-germanium relative to silicon oxide.

Figure 2E:
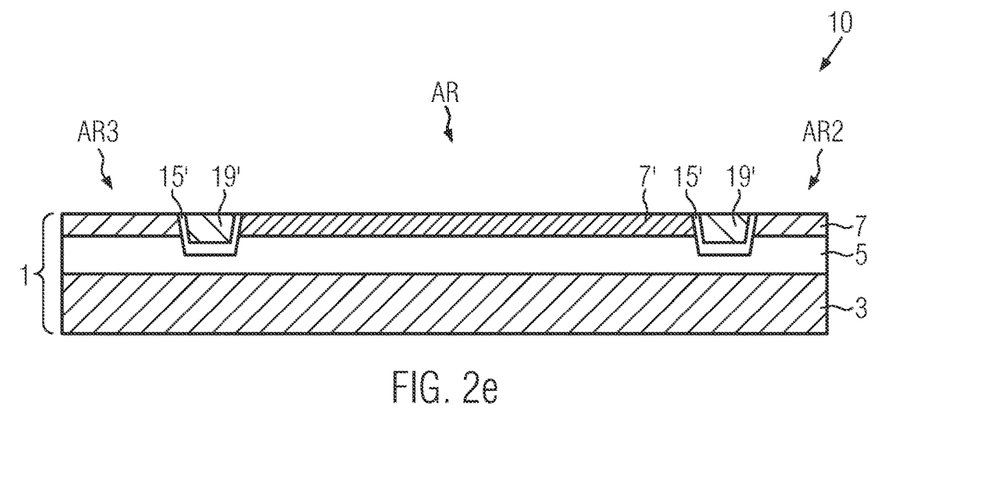

With regard to FIG. 2e, the semiconductor device 10 is schematically illustrated at a more advanced stage during fabrication, after a polishing process is completed, such as a CMP process. As a result, the silicon oxide layer 9' and an upper portion of the trench isolation structure 19 and the isolation liner 15 may be removed, resulting in the remnant trench isolation structure 19' and the remnant isolation liner 15' separating the active silicon-germanium layer 7' in the active region AR from the active semiconductor layer 7 outside the active region AR in a second active region AR2 and a third active region AR3. The second and third active regions AR2 and AR3 may be adjacent to the active region AR and may represent regions in and above which semiconductor devices, e.g., at least one NMOS device, are to be fabricated.

Figure 3A:
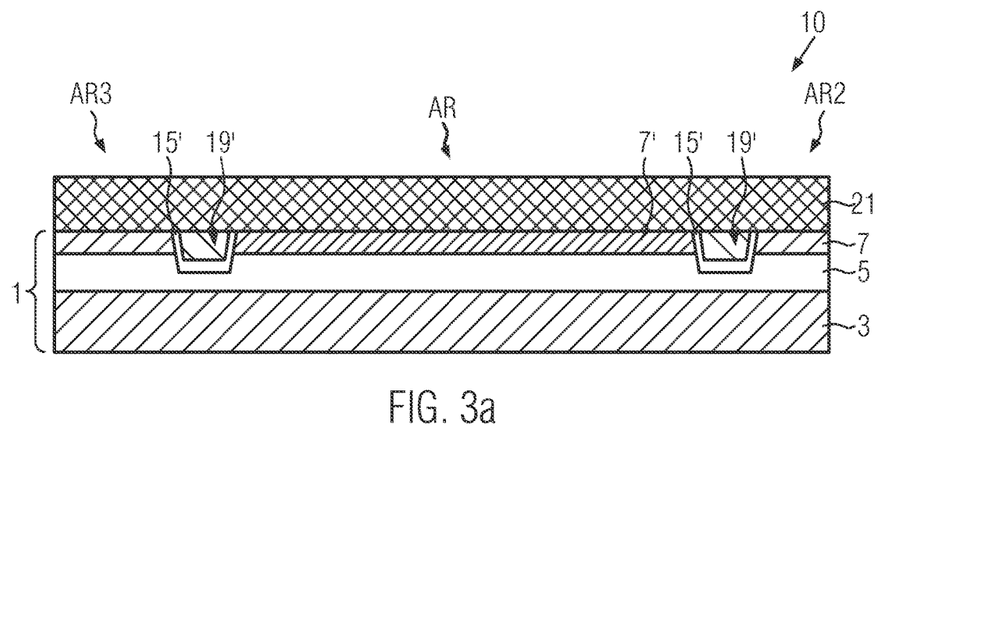
FIGS. 3a-3c schematically illustrate in cross-sectional views a further process in accordance with some illustrative embodiments of the present disclosure.

With regard to FIG. 3a, further processing of the semiconductor device structure 10 in accordance with some illustrative embodiments of the present disclosure is schematically illustrated. The semiconductor device structure 10 as illustrated in FIG. 3a has a further passivation layer 21, e.g., a nitride material layer, formed over the semiconductor device structure from FIG. 2e. In accordance with a special illustrative example, the further passivation layer 21 may be formed by depositing nitride material in accordance with CVD techniques.

Figure 3B:
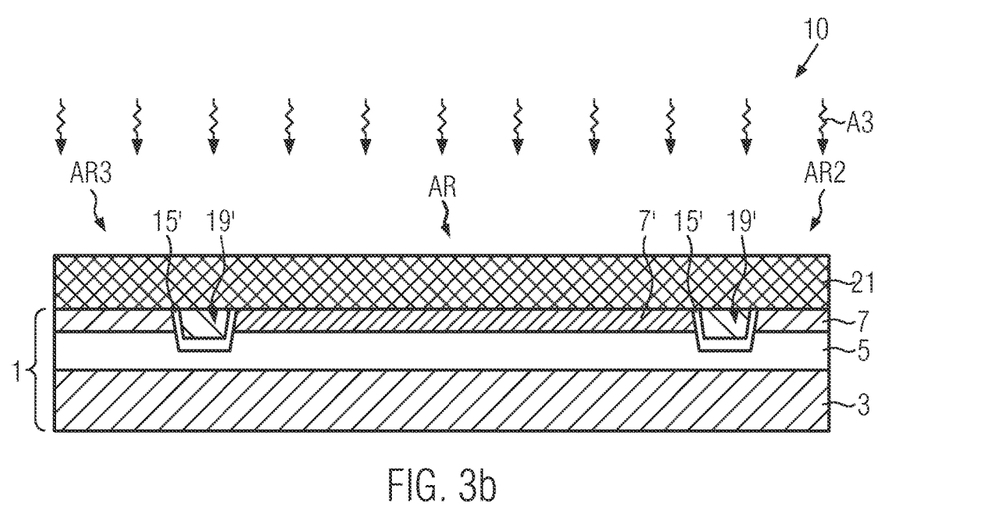

With regard to FIG. 3b, the semiconductor device structure 10 is schematically illustrated at a more advanced stage during fabrication, when a further annealing process A3 is performed. In accordance with illustrative embodiments of the present disclosure, the annealing process A3 may be performed at a temperature in a range from about 1000-1200° C., e.g., at about 1050° C., for a duration in a time interval from about 30-90 minutes, e.g., for about 60 minutes. In accordance with a special illustrative example herein, the further annealing process A3 may comprise a slow temperature ramp down. Accordingly, a good quality of remnant trench isolation structure 19' may be achieved.

Figure 3C:
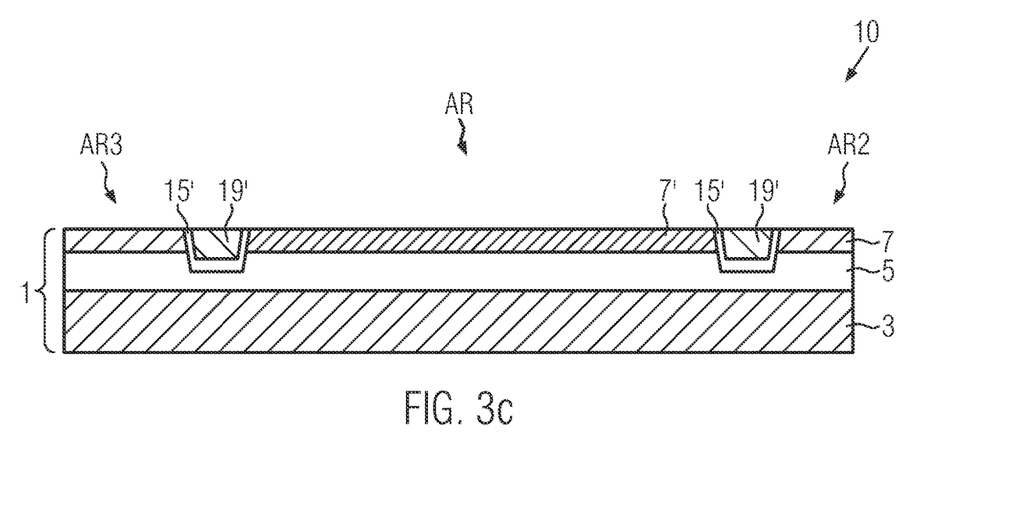

With regard to FIG. 3c, the semiconductor device structure 10 is schematically illustrated at a more advanced stage during fabrication, after the passivation layer 21 is removed and a surface cleaning process is performed.

In accordance with some illustrative embodiments of the present disclosure, the processing may continue by forming gate structures (not illustrated) over the active region AR and adjacent active regions. Therefore, a PMOS device (not illustrated) may be formed in an above the active region AR and at least one NMOS device (not illustrated) may be formed in at least one of the adjacent active regions AR2 and AR3 so as to implement a CMOS device structure (not illustrated).

After a complete reading of the present application, a person skilled in the art will appreciate that the present disclosure provides semiconductor devices, since fabricated semiconductor device structures may comprise PMOS devices (to be formed in subsequent processing in the active region AR over the active silicon-germanium layer 7' accommodating the channel region of a PMOS device), where stress loss of the active silicon-germanium layer 7' is suppressed during the fabrication process. As silicon-germanium stress may be relaxed during STI processing, because of cuts through the silicon-germanium material may result in loss of stress upon formation of STI regions. The various process flows as described above propose to combine an STI module and a silicon-germanium-forming module in such a way that the loss of stress in the silicon-germanium material may be reduced during the STI process. In accordance with some illustrative embodiments of the present disclosure, no cut through silicon-germanium causing loss of stress is performed.

In accordance with a special illustrative embodiment of the present disclosure, a process flow may comprise depositing a silicon-germanium layer on an SOI wafer, depositing a polymer-assisted deposition (pad) nitride on the deposited silicon-germanium layer and performing RX litho and STI etch processes in order to provide an active region delineated by STI regions, performing an STI liner oxidation and the deposition of STI material together with an annealing process for providing a good fill of STI material, applying a polishing process to the STI and removing pad nitride material in the active region where a PMOS device is to be formed, performing a silicon-germanium condensation anneal to drive silicon-germanium material from the deposited silicon-germanium layer into the active semiconductor layer of the SOI wafer, removing the remaining pad nitride outside the active region (on active regions where NMOS devices are to be formed, such as the active regions AR2, AR3), subsequently removing the remnant silicon-germanium layer and polishing the STI down to the active semiconductor layer and active silicon-germanium layer, depositing a further pad nitride and performing another anneal to improve the STI properties and further continuing the processing by depositing a gate material over the active region and performing a patterning for forming gate structures.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a semiconductor device, the method comprising:
   providing an SOI substrate comprising a base substrate, a buried insulating material layer formed on said base substrate, and an active semiconductor layer formed on said buried insulating material layer;
   forming a germanium-comprising layer on an exposed surface of said active semiconductor layer;
   forming a passivation layer above said germanium-comprising layer;
   forming a trench isolation structure extending through said germanium-comprising layer and said active semiconductor layer, said trench isolation structure separating a first device region from a second device region;
   performing an annealing process after said trench isolation structure is formed and while said passivation layer covers said germanium-comprising material in said first device region, said annealing process converting said active semiconductor layer in said second device region to a germanium-comprising active layer which is formed on said buried insulating material layer and converting said germanium-comprising material in said second device region to an oxide layer which is formed on said germanium-comprising active layer; and
   removing said oxide layer to expose an upper surface of said germanium-comprising active layer.

2. The method of claim 1, wherein performing said annealing process comprises performing a dry oxidation process with a temperature in a range from about 1000° C. to about 1200° C. for less than about 2 minutes.

3. The method of claim 2, wherein said dry oxidation process is performed for a duration from a range of about 50 seconds to about 80 seconds.

4. The method of claim 1, wherein forming said trench isolation structure comprises etching a trench into said passivation layer, said trench extending into said active semiconductor layer for exposing an upper surface of said buried insulating material layer.

5. The method of claim 1, further comprising removing said passivation layer from above said germanium-comprising material in said second device region before said annealing process is performed.

6. The method of claim 5, wherein removing said oxide layer comprises performing a chemical mechanical polishing (CMP) process after removing said passivation layer from above said germanium-comprising material in said first device region.

7. The method of claim 1, wherein said germanium-comprising material is formed from silicon-germanium and said active semiconductor layer is formed from silicon.

8. The method of claim 1, further comprising forming a further passivation layer on said active germanium-comprising layer and performing a further annealing process at a temperature in a range from about 1000° C. to about 1200° C. for a time duration from a time interval between about 0.5 hour to about 1.5 hours.

9. The method of claim 1, wherein said buried insulating material layer is formed from silicon oxide.

10. A method of forming a CMOS structure, the method comprising:
    providing an SOI substrate comprising a base substrate, a buried insulating material layer formed on said base substrate, and an active semiconductor layer formed on said buried insulating material layer;

forming a germanium-comprising layer on an exposed surface of said active semiconductor layer;

forming a trench isolation structure, said trench isolation structure extending through said germanium-comprising layer and said active semiconductor layer, said trench isolation structure defining at least a first active region in which a PMOS device is to be formed and a second active region in which an NMOS device is to be formed;

forming a nitride material on said germanium-comprising layer in said first and second active regions;

selectively removing said nitride material in said first active region and leaving said nitride material in said second active region;

performing an annealing process after said nitride material is selectively removed and while said nitride material covers said germanium-comprising material in said second active region, said annealing process resulting in an oxide layer formed on a germanium-comprising active layer which is formed on said buried insulating material layer in said first active region; and removing said oxide layer, to expose an upper surface of said germanium-comprising active layer in said first active region.

11. The method of claim 10, further comprising removing said remaining nitride material and said germanium-comprising layer in said second active region.

12. The method of claim 11, further comprising forming a PMOS device in and above said first active region and forming an NMOS device in and above said second active region.

13. The method of claim 10, wherein performing said annealing process comprises performing a dry oxidation process with a temperature in a range from about 1000° C. to about 1200° C. for less than about 2 minutes.

14. The method of claim 13, wherein said dry oxidation process is performed for a duration from a range of about 50 seconds to about 80 seconds.

15. The method of claim 10, wherein forming said trench isolation structure comprises etching a trench into said nitride material, said trench extending into said active semiconductor layer for exposing an upper surface of said buried insulating material layer.

16. The method of claim 10, wherein removing said oxide layer comprises performing a chemical mechanical polishing (CMP) process after removing said nitride material from above said germanium-comprising material in said second active region.

17. The method of claim 10, further comprising forming a further passivation layer so as to cover said first and second active regions by said further passivation layer after said germanium-comprising active layer is exposed, and performing a further annealing process at a temperature in a range from about 1000° C. to about 1200° C. for a time duration from a time interval between about 0.5 hour to about 1.5 hours.

18. The method of claim 17, further comprising removing said further passivation layer covering said first and second active regions after said further annealing process is performed, and forming a PMOS device in and above said first active region and forming an NMOS device in and above said second active region.

19. The method of claim 10, wherein said germanium-comprising material is formed from silicon-germanium and said active semiconductor layer is formed from silicon.

20. A method of forming a semiconductor device, the method comprising:

providing an SOI substrate comprising a base substrate, a buried insulating material layer formed on said base substrate, and an active semiconductor layer formed on said buried insulating material layer;

forming a germanium-comprising layer on an exposed surface of said active semiconductor layer;

forming a trench isolation structure, said trench isolation structure extending through said germanium-comprising layer and said active semiconductor layer;

performing a first annealing process after forming said trench isolation structure, said first annealing process resulting in an oxide layer disposed on a germanium-comprising active layer that is formed on said buried insulating material layer;

removing said oxide layer, wherein an upper surface of said germanium-comprising active layer is exposed;

forming a passivation layer on said active germanium-comprising layer; and performing a second annealing process at a temperature in a range from about 1000° C. to about 1200° C. for a time duration from a time interval between about 0.5 hour to about 1.5 hours.

* * * * *